United States Patent [19]
Kerrigan et al.

[11] Patent Number: 6,137,694
[45] Date of Patent: Oct. 24, 2000

[54] INTEGRAL EMI SHIELDING FOR COMPUTER ENCLOSURES

[75] Inventors: Brian Michael Kerrigan, Austin; Daniel Paul Beaman, Cedar Park; Jeffrey William Young, Round Rock, all of Tex.

[73] Assignee: International Business Machines Corporation, Armonk, N.Y.

[21] Appl. No.: 09/174,607

[22] Filed: Oct. 19, 1998

[51] Int. Cl.[7] ............................................. H05K 9/00

[52] U.S. Cl. .......................... 361/818; 361/683; 361/684; 361/685; 361/686; 361/752; 361/753; 361/796; 361/797; 361/800; 361/801; 361/802; 361/816; 361/818; 174/35 R; 174/35 MS; 206/719; 206/721

[58] Field of Search ..................................... 361/683–686, 361/752–753, 756, 796, 797, 800–802, 816, 818, 825; 174/35 R, 51, 35 MS; 206/719, 721

[56] References Cited

U.S. PATENT DOCUMENTS

| | | | |
|---|---|---|---|
| 5,067,041 | 11/1991 | Cooke et al. | 361/394 |
| 5,262,923 | 11/1993 | Batta et al. | 361/685 |
| 5,278,351 | 1/1994 | Herrick | 174/35 R |
| 5,748,442 | 5/1998 | Toor | 361/685 |

*Primary Examiner*—Jeffrey Gaffin
*Assistant Examiner*—Tuan Dinh
*Attorney, Agent, or Firm*—Casimer K. Salys; Felsman, Bradley, Vaden, Gunter & Dillon, LLP

[57] ABSTRACT

A computer has a chassis with a variety of electronic components mounted to it. The chassis is generally rectangular and slidably mounted within a sheet metal enclosure. The enclosure closely receives the chassis to eliminate excessive movement therebetween. The enclosure is essentially a four-sided box with an opening at either end. A front panel is attached to one of the openings. The front panel and the enclosure each contain half of a labyrinth seal which seals one end of the enclosure when the front panel is assembled to the enclosure. A similar seal is formed at the other end of the enclosure when the chassis is mounted in the enclosure. The labyrinth seals have a folded configuration which forms an interleaving arrangement.

11 Claims, 4 Drawing Sheets

INTEGRAL EMI SHIELDING FOR COMPUTER ENCLOSURES

TECHNICAL FIELD

This invention relates in general to electronic computers and in particular to a computer having EMI shielding which is integral with its external housing.

BACKGROUND ART

Electronic computers have a variety of electronic components such as printed circuit boards, connectors, a ventilation fan and the like. Each of these components is rigidly mounted to an internal frame or chassis. An external housing or enclosure is removably attached to the chassis for allowing the user access to the components. The enclosure also protects the exposed components from physical contact and shields the components from electromagnetic interference (EMI).

In the prior art, most computers utilize additional EMI shielding materials within the enclosure. Such materials typically comprise commercially available leafsprings or fingerstock gaskets around all externally facing seams of the enclosure. These materials are used to ground and dissipate EMI noise from the external environment. Although this design is workable, its EMI attenuation could be improved. In addition, these designs are relatively expensive as gasketing costs approximately 45 to 95 cents per linear foot.

DISCLOSURE OF THE INVENTION

A computer has a chassis with a variety of electronic components mounted to it. The chassis is generally rectangular and slidably mounted within a sheet metal enclosure. The enclosure closely receives the chassis to eliminate excessive movement therebetween. The enclosure is essentially a four-sided box with an opening at either end. A front panel is attached to one of the openings. The front panel and the enclosure each contain half of a labyrinth seal which seals one end of the enclosure when the front panel is assembled to the enclosure. A similar seal is formed at the other end of the enclosure when the chassis is mounted in the enclosure. The labyrinth seals have a folded configuration which forms an interleaving arrangement.

BEST MODE FOR CARRYING OUT THE INVENTION

Figure 1:
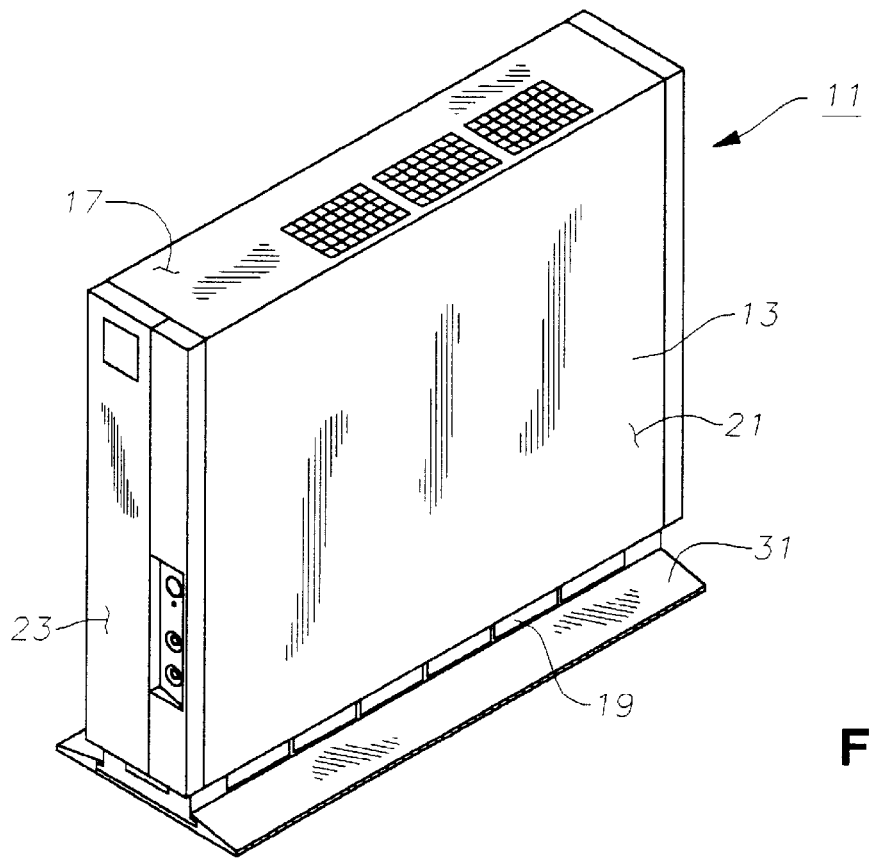
FIG. 1 is a front isometric view of a computer constructed in accordance with the invention.
Figure 2:
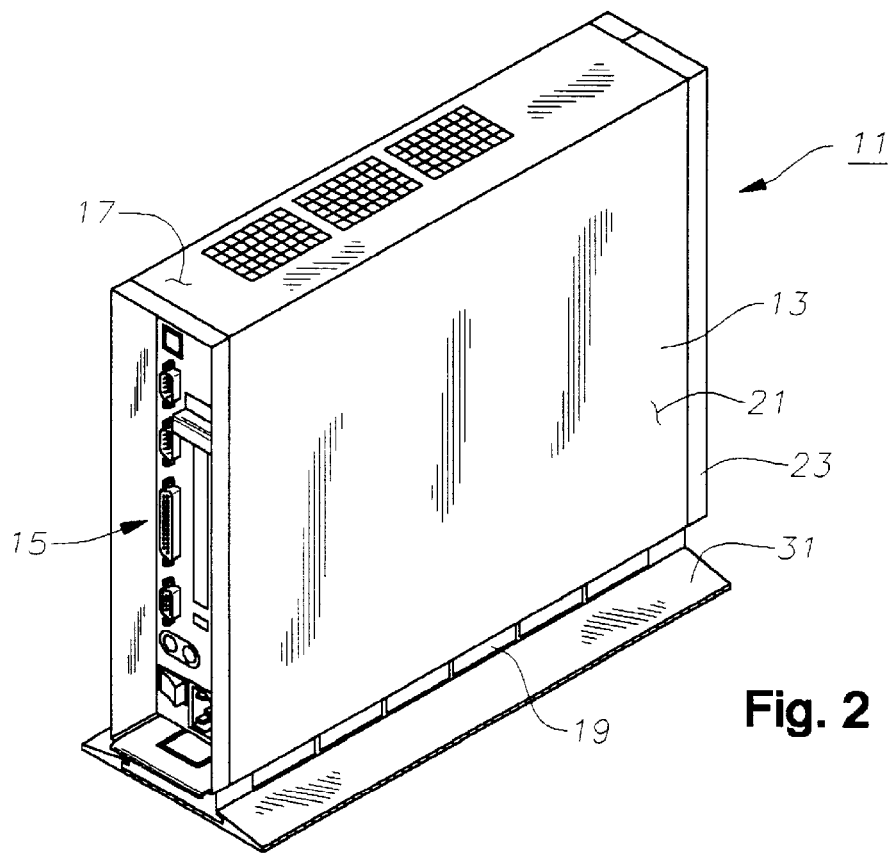
FIG. 2 is a rear isometric view of the computer of FIG. 1.

Referring to FIGS. 1 and 2, a network computer 11 is shown. Computer 11 has an external metal housing or enclosure 13 and an internal metal frame or chassis 15. Enclosure 13 is essentially a four-sided rectangular box with an opening on each end and formed from a single sheet of metal which is bent to form four corners. Enclosure 13 has a top panel 17, a bottom panel 19, two side panels 21 and a front panel 23 for its forward opening. A base or pedestal 31 is mounted to the lower surface of bottom 19.

Figure 3:
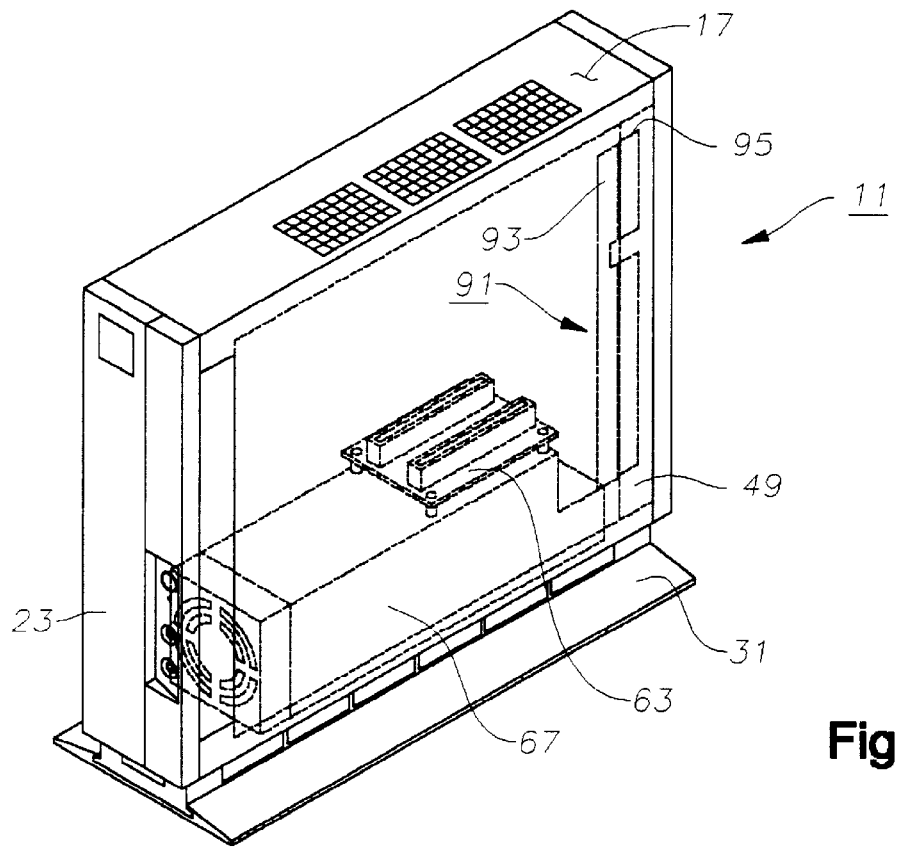
FIG. 3 is a front isometric view of the computer of FIG. 1 showing some of its internal structure.
Figure 4:
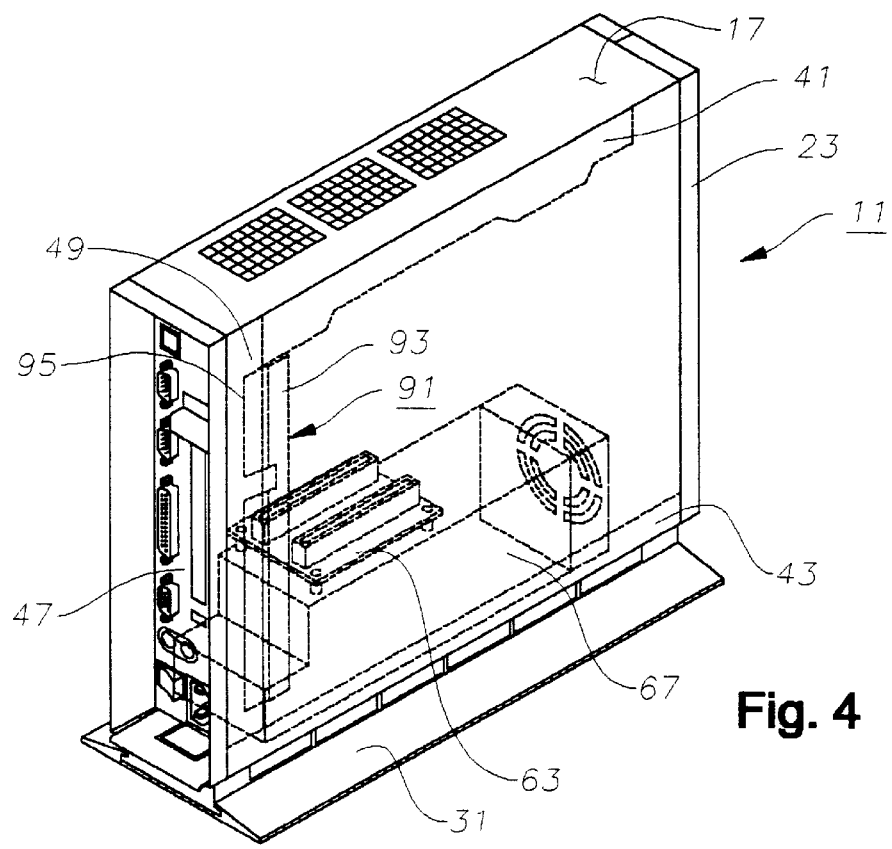
FIG. 4 is a rear isometric view of the computer of FIG. 1 showing some of its internal structure.
Figure 5:
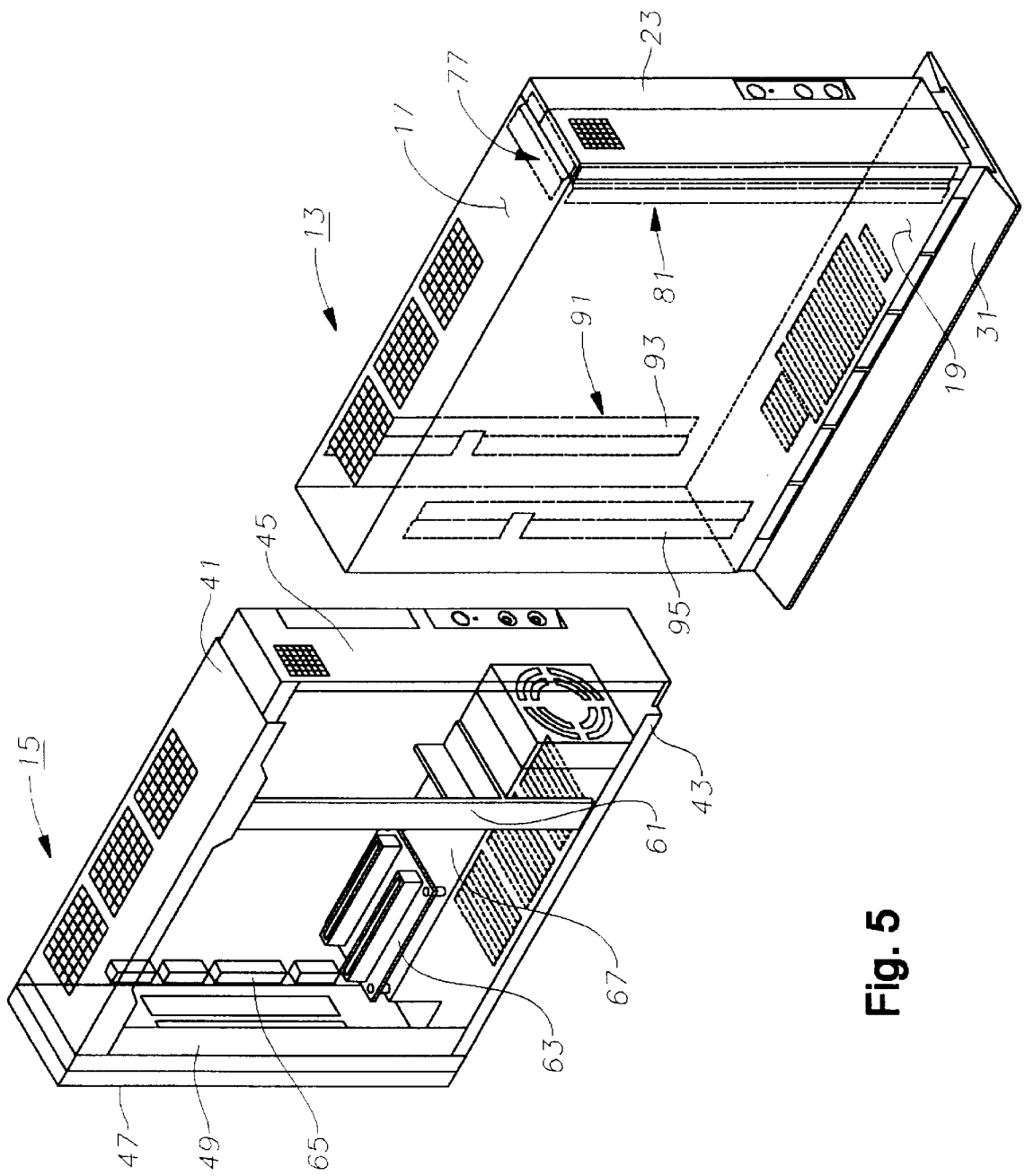
FIG. 5 is a front isometric, partially transparent view of the computer of FIG. 1 shown with its chassis removed from its enclosure.

As shown in FIGS. 3–5, chassis 15 is slidably mounted within enclosure 13. Chassis 15 has a rectangular perimeter of four wall-like frame members including a top 41, a bottom 43 and front and rear ends 45, 47. This configuration allows the vertical sides of chassis 15 to remain open and uncovered. A pair of flat vertical braces or flanges 49 extend forward from the sides of rear end 47 between top 41 and bottom 43. Flanges 49 are symmetrical to one another and perpendicular to top 41 and bottom 43. A strut 61 is mounted between top 41 and bottom 43 and is parallel to flanges 49. Chassis 15 also has a plurality of electronic components such as printed circuit boards 63, connectors 65, a ventilation fan 67 and the like mounted to it. For simplicity, only a few of the components of computer 11 are illustrated.

Figure 6:
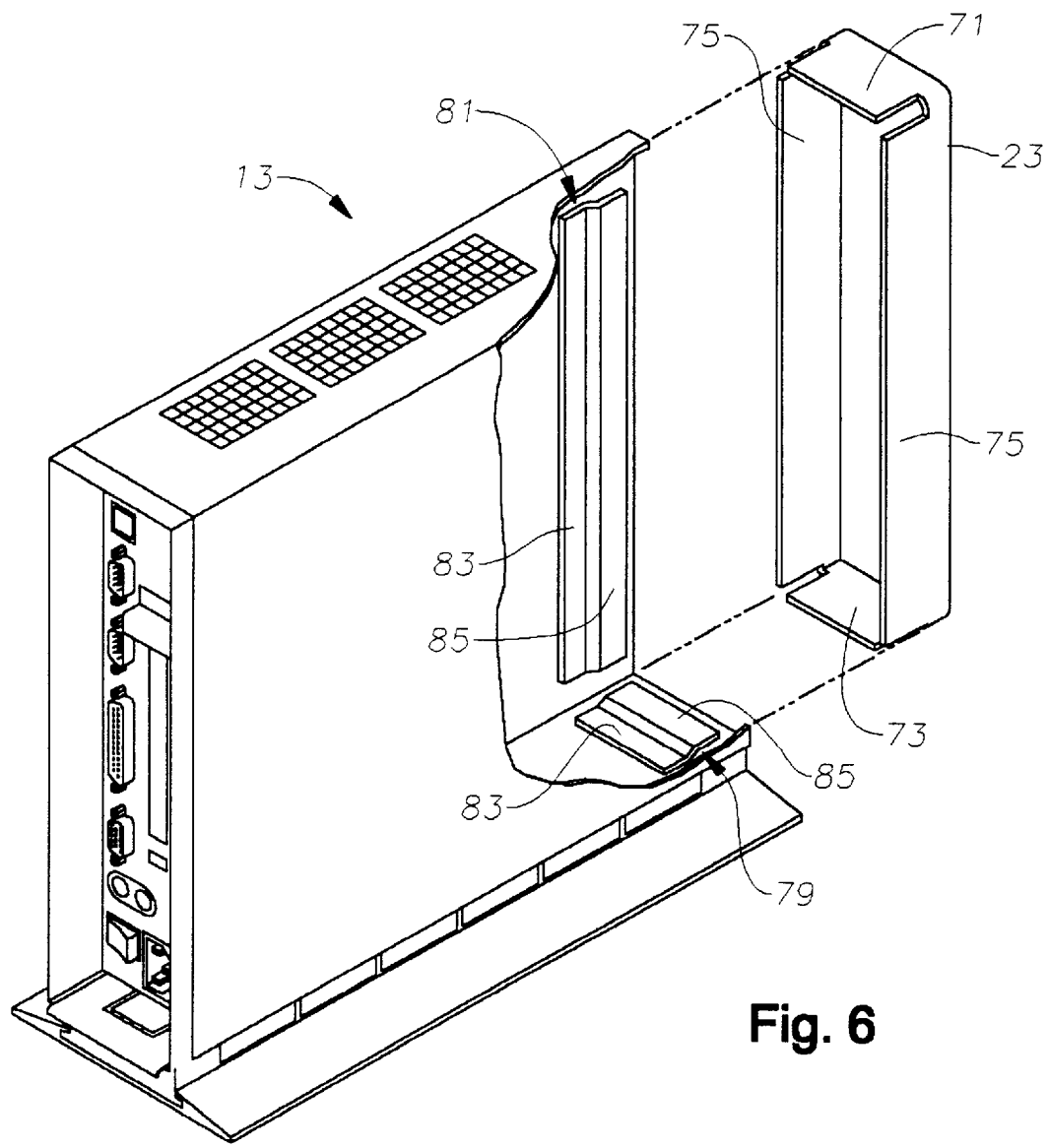
FIG. 6 is a rear isometric, partially transparent view of the enclosure of FIG. 5 shown with its front panel exploded.
Figure 7:
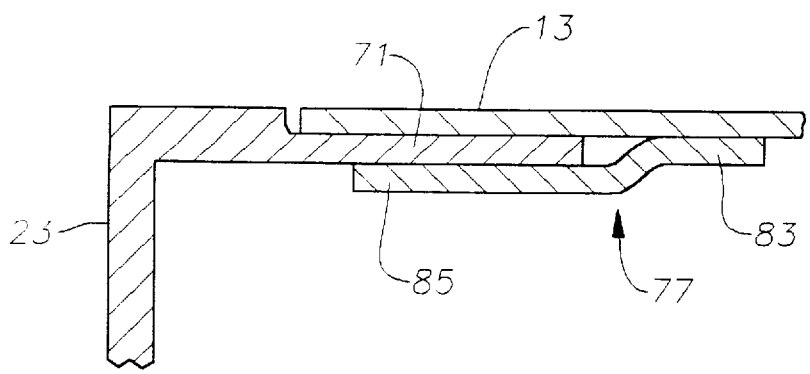
FIG. 7 is a sectional top view of a corner portion of the enclosure of FIG. 5.

Referring now to FIG. 6, front panel 23 has a rearward-extending upper flange 71, lower flange 73 and two side flanges 75 adjacent to its rectangular upper, lower and the side edges, respectively. Upper and lower flanges 71, 73 are parallel to one another while side flanges 75 are perpendicular to flanges 71, 73 such that their corners almost touch one another. Flanges 71, 73, 75 are provided for sliding engagement with mating slots in enclosure 13. The slots are defined by a metal upper strip 77, lower strip 79 and two side strips 81 located within an interior of enclosure 13 adjacent to front panel 23 on the top panel 17, bottom panel 19 and sides panels 21, respectively. Strips 77, 79 are identical and parallel to one another while strips 81 are identical and perpendicular to strips 77, 79 such that their corners almost touch one another. Each of the strips 77, 79, 81 define a slot which faces toward front panel 23 and receives one of flanges 71, 73, 75, respectively. Each strip 77, 79, 81 has a mounting portion 83 which is fastened to an inner surface of enclosure 13, and an offset portion 85 which is spaced away from the inner surface of enclosure 13. Thus, as shown in FIG. 7, the narrow slots are defined between the inner surfaces of enclosure 13 and the offset portions 85. In the preferred embodiment, flanges 71, 73, 75 form a labyrinth seal with strips 77, 79, 81, respectively, and are clearance fit to one another.

Referring back to FIG. 4, enclosure 13 also has a pair of symmetrical metallic strips 91 mounted just inside the opening at its rearward end. Strips 91 are virtually identical to strips 81. Each strip 91 has a mounting portion 93 which is fastened to the inner surface of one of the side panels 21, and an offset portion 95 which is spaced away from side panels 21 to define a vertically oriented slot. As described above for front panel 23, flanges 49 form a labyrinth seal with strips 91 and are clearance fit to one another when chassis 15 is slidably mounted in enclosure 13.

In operation, front panel 23 is mounted to enclosure 13 (FIG. 5) such that flanges 71, 73, 75 insert into the slots defined by strips 77, 79, 81, respectively. This interface forms a seal on the forward end of computer 11 which will attenuate EMI noise. Fasteners (not shown) may be used to permanently secure front panel 23 to enclosure 13. To complete assembly of computer 11, enclosure 13 closely receives chassis 15 such that top panel 17 and bottom panel 19 slidably abut top 41 and bottom 43. In addition, the vertical side edge portions of top 41 and bottom 43 slidably engage side panels 21 to eliminate excessive movement between chassis 15 and enclosure 13. When chassis 15 is almost completely inserted into enclosure 13, flanges 49 will slide into the slots defined by strips 91 to form an EMI noise seal at the rearward end of computer 11. The invention has several significant advantages. This EMI shielding design is capable of attenuating a significant 30 db of EMI noise as compared to the 10 to 15 db noise attenuation of conventional designs such as gaskets. The invention is integrated directly into the sheet metal enclosure of the computer and has no protruding fingerstock or gasket material which must be carefully handled and assembled to attain a proper EMI shield. This design is also much less expensive than its predecessors.

While the invention has been shown or described in only some of its forms, it should be apparent to those skilled in the art that it is not so limited, but is susceptible to various changes without departing from the scope of the invention. For example, the invention may be used to attenuate EMI in enclosures housing telecom, radio frequency and other types of electronic equipment.

We claim:

1. An electronic device, comprising:

a rectangular enclosure having two ends and two side panels joined by top and bottom panels;

a chassis removably mounted in the enclosure;

a plurality of electronic components mounted to the chassis;

an end panel which forms one of the ends of the enclosure, the end panel having an upper edge, a lower edge and two side edges;

an upper flange, a lower flange and two side flanges extending from the end panel adjacent to the upper edge, the lower edge and the side edges, respectively, of the end panel;

an upper strip, a lower strip and two side strips located within an interior of the enclosure adjacent to the end panel on the top, bottom and sides panels, respectively; and wherein each of the strips define a slot which faces toward the end panel and receives one of the flanges, the strips and the flanges being formed from metal to attenuate EMI noise.

2. The electronic device of claim 1 wherein the top, bottom and side panels of the enclosure are formed from a single sheet of metal which is bent to form four corners.

3. The electronic device of claim 1 wherein each of the upper, lower and side strips has a mounting portion which is fastened to one of the top, bottom and side panels, respectively, and an offset portion which is spaced away from one of the top, bottom and side panels, respectively, to define the slots.

4. The electronic device of claim 1 wherein the end panel forms a front of the electronic device.

5. The electronic device of claim 1 wherein the chassis is closely received by and slidably mounted in an opening in the enclosure opposite the end panel; and wherein the electronic device further comprises:

a pair of secondary strips mounted to the interior of the enclosure on each of the side panels adjacent to the opening, each secondary strip defining a slot;

a pair of flanges on the chassis that engage the slots defined by the secondary strips to attenuate EMI noise.

6. A computer, comprising:

a rectangular enclosure having two ends and two side panels joined by top and bottom panels;

an opening defined by one end of the enclosure;

chassis closely received by and slidably mounted in the opening in the enclosure;

a plurality of electronic components mounted to the chassis;

an end panel which forms the other of the ends of the enclosure opposite the opening, the end panel having an upper edge, a lower edge and two side edges;

an upper flange, a lower flange and two side flanges extending from the end panel adjacent to the upper edge, the lower edge and the side edges, respectively, of the end panel;

an upper strip, a lower strip and two side strips located within an interior of the enclosure adjacent to the end panel on the top, bottom and sides panels, respectively;

a pair of secondary strips mounted to the interior of the enclosure on each of the side panels adjacent to the opening, each secondary strip defining a slot;

a pair of flanges on the chassis that engage the slots defined by the secondary strips; and wherein each of the strips defines a slot which faces outward from the enclosure and receives one of the flanges, the strips and the flanges being formed from metal to attenuate EMI noise.

7. The computer of claim 6 wherein the top, bottom and side panels of the enclosure are formed from a single sheet of metal which is bent to form four corners.

8. The computer of claim 6 wherein each of the upper, lower and side strips has a mounting portion which is fastened to one of the top, bottom and side panels, respectively, and an offset portion which is spaced away from one of the top, bottom and side panels, respectively, to define the slots; and wherein each of the secondary strips has a mounting portion which is fastened to one of the side panels and an offset portion which is spaced away from one of the side panels to define the slots.

9. The computer of claim 6 wherein the end panel forms a front of the computer and the opening is at a rearward end of the computer.

10. A computer, comprising:

a rectangular enclosure formed from a single sheet of metal which is bent to form four corners, a first end and an opening on a second end opposite the first end;

an end panel for attachment to the first end of the enclosure, the end panel having a plurality of primary flanges extending therefrom;

a chassis closely received by and slidably mounted in the opening in the enclosure, the chassis having a plurality of secondary flanges and electronic components mounted thereto;

a plurality of primary and secondary strips mounted to an interior of the enclosure adjacent to the first end and the opening, respectively, each of the strips having a mounting portion which is fastened to the enclosure, and an offset portion which is spaced away from the enclosure, each of the primary and secondary strips defining a slot which faces toward the end panel and the opening, respectively, such that each of the primary and secondary strips receives one of the primary and secondary flanges, respectively, for attenuating EMI noise.

11. The computer of claim 10 wherein the end panel forms a front of the computer and the opening is at a rearward end of the computer.

* * * * *